(12) United States Patent
Zhang

(10) Patent No.: US 10,990,210 B2
(45) Date of Patent: Apr. 27, 2021

(54) TOUCH CONTROL DISPLAY, METHOD FOR CONTROLLING TOUCH CONTROL DISPLAY AND STORAGE MEDIUM

(71) Applicants: Ordos Yuansheng Optoelectronics Co., Ltd., Inner Mongolia (CN); BOE Technology Group Co., Ltd., Beijing (CN)

(72) Inventor: Jinzhong Zhang, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/522,723

(22) Filed: Jul. 26, 2019

(65) Prior Publication Data
US 2020/0042127 A1 Feb. 6, 2020

(30) Foreign Application Priority Data
Aug. 3, 2018 (CN) .......................... 201810878963.X

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0416* (2013.01); *G06F 3/0445* (2019.05); *G06F 3/0446* (2019.05); *H01L 27/323* (2013.01)

(58) Field of Classification Search
None
See application file for complete search history.

(56) References Cited

U.S. PATENT DOCUMENTS

| | | | |
|---|---|---|---|
| 2012/0169400 A1 | 7/2012 | Liu | |
| 2017/0048516 A1 | 2/2017 | Yang et al. | |
| 2017/0308199 A1 | 10/2017 | Liu et al. | |
| 2017/0336888 A1 | 11/2017 | Wang et al. | |
| 2018/0113531 A1* | 4/2018 | Na | G06F 3/0412 |

FOREIGN PATENT DOCUMENTS

| | | |
|---|---|---|
| CN | 103529993 A | 1/2014 |
| CN | 104360780 A | 2/2015 |
| CN | 104730719 A | 6/2015 |
| CN | 106783909 A | 5/2017 |

OTHER PUBLICATIONS

First office action of Chinese application No. 201810878963.X dated Dec. 24, 2020.

* cited by examiner

*Primary Examiner* — Nicholas J Lee
(74) *Attorney, Agent, or Firm* — Fay Sharpe LLP

(57) ABSTRACT

Disclosed are a touch control display, a method for controlling a touch control display, and a storage medium, in the field of display technology. The touch control display includes: an organic light emitting diode (OLED) display panel and a touch control component; the OLED display panel includes a base substrate and a plurality of pixel electrodes on the base substrate; and the touch control component includes a plurality of touch control electrode lines between the plurality of pixel electrodes, and any one touch control electrode line of the plurality of touch control electrode lines is configured to form a first touch control capacitor with a pixel electrode adjacent to the any one touch control electrode line.

16 Claims, 10 Drawing Sheets u

TOUCH CONTROL DISPLAY, METHOD FOR CONTROLLING TOUCH CONTROL DISPLAY AND STORAGE MEDIUM

CROSS-REFERENCE TO RELATED APPLICATION

This application claims priority to Chinese Patent Application No.: 201810878963.X, filed on Aug. 3, 2018 and entitled "Touch Control Display and Method for Controlling Touch Control Display", the entire contents of which are incorporated herein by reference.

TECHNICAL FIELD

The present disclosure relates to the field of display technology, and particularly to a touch control display, a method for controlling a touch control display, and a storage medium.

BACKGROUND

A touch control display is a display having a touch control function, and generally includes a display panel and a touch control component.

A touch control display includes an organic light-emitting diode (OLED) display panel and a touch control component disposed at the outside of a side, displaying images, of the OLED display panel. When a user touches the touch control component to control the OLED display panel, the touch control component can acquire touch control information of the user.

SUMMARY

Embodiments of the present disclosure provide a touch control display and a method for controlling a touch control display, and a storage medium. The technical solutions are as follows.

According to an aspect of the present disclosure, there is provided a touch control display, comprising an organic light emitting diode (OLED) display panel and a touch control component, wherein the OLED display panel comprises a base substrate and a plurality of pixel electrodes on the base substrate; and the touch control component comprises a plurality of touch control electrode lines between the plurality of pixel electrodes, and any one touch control electrode line of the plurality of touch control electrode lines is configured to form a first touch control capacitor with a pixel electrode adjacent to the any one touch control electrode line.

Optionally, the OLED display panel comprises an electrode layer on the base substrate; and the any one touch control electrode line is configured to form a second touch control capacitor with the electrode layer.

Optionally, the plurality of touch control electrode lines comprises a plurality of first electrode lines arranged along a first direction and a plurality of second electrode lines arranged along a second direction, and the first direction is not parallel to the second direction.

Optionally, the first direction is perpendicular to the second direction.

Optionally, the plurality of first electrode lines and the plurality of second electrode lines define a plurality of regions on the base substrate, each of the regions has at least one display unit, each of the at least one display unit comprises two electrodes and an electroluminescent layer between the two electrodes, and one of the two electrodes is the pixel electrode and the other electrode is the electrode layer.

Optionally, the pixel electrode is an anode and the electrode layer is a cathode.

Optionally, source traces and drain traces are on the base substrate, and the plurality of first electrode lines is disposed in the same layer as the source/drain traces.

Optionally, each of the first electrode lines is a composite structure of titanium, aluminum and titanium.

Optionally, each of the second electrode lines is a composite structure of indium tin oxide, silver, and indium tin oxide.

Optionally, the plurality of second electrode lines is disposed in the same layer as the plurality of pixel electrodes.

Optionally, the touch control display further comprises: a control component connected to the touch control component.

Optionally, the OLED display panel comprises an electrode layer on the base substrate; the any one touch control electrode line is configured to form a second touch control capacitor with the electrode layer, and acquire touch control information according to capacitance changes of the second touch control capacitor and the first touch control capacitor; the plurality of touch control electrode lines comprises a plurality of first electrode lines arranged along a first direction and a plurality of second electrode lines arranged along a second direction; the plurality of first electrode lines and the plurality of second electrode lines define a plurality of regions on the base substrate, each of the regions has at least one display unit, each of the at least one display unit comprises two electrodes and an electroluminescent layer between the two electrodes, and one of the two electrodes is the pixel electrode and the other electrode is the electrode layer; source traces and drain traces are on the base substrate, and the plurality of first electrode lines is disposed in the same layer as the source/drain traces; and the plurality of second electrode lines is disposed in the same layer as the plurality of pixel electrodes.

According to another aspect of the present disclosure, there is provided a method for controlling a touch control display, applied to a touch control display, wherein the touch control display comprises an organic light emitting diode (OLED) display panel and a touch control component; the OLED display panel comprises a base substrate and a plurality of pixel electrodes on the base substrate; and the touch control component comprises a plurality of touch control electrode lines between the plurality of pixel electrodes; the method comprising: detecting whether a capacitance of a first touch control capacitor changes, wherein the first touch control capacitor is a capacitor formed by any one touch control electrode line of the plurality of touch control electrode lines and a pixel electrode adjacent to the any one touch control electrode line; and acquiring touch control information according to a capacitance change of the first touch control capacitor when the capacitance of the first touch control capacitor changes.

Optionally, detecting whether a capacitance of a first touch control capacitor changes comprises: loading an alternating current of a specified frequency between the any one touch control electrode line and the pixel electrode adjacent to the any one touch control electrode line; and determining that the capacitance of the first touch control capacitor changes when the frequency of the alternating current between the touch control electrode line and the pixel electrode adjacent to the touch control electrode line changes; and acquiring touch control information according to a capacitance change of the first touch control capacitor comprises: determining the touch control information according to a position where the any one touch control electrode line is.

Optionally, the OLED display panel comprises an electrode layer on the base substrate, the method further comprising: detecting whether a capacitance of a second touch control capacitor changes, wherein the second touch control capacitor is a capacitor formed by any one touch control electrode line of the plurality of touch control electrode lines and the electrode layer; and acquiring the touch control information according to a capacitance change of the second touch control capacitor when the capacitance of the second touch control capacitor changes.

Optionally, detecting whether a capacitance of a second touch control capacitor changes comprises: loading an alternating current of a specified frequency between the any one touch control electrode line and the electrode layer; and determining that the capacitance of the second touch control capacitor changes when the frequency of the alternating current between the any one touch control electrode line and the electrode layer changes; and acquiring touch control information according to a capacitance change of the second touch control capacitor comprises: determining the touch control information according to a position where the any one touch control electrode line is.

Optionally, detecting whether a capacitance of a first touch control capacitor changes comprises: loading an alternating current of a specified frequency between the any one touch control electrode line and the pixel electrode adjacent to the any one touch control electrode line; and determining that the capacitance of the first touch control capacitor changes when the frequency of the alternating current between the any one touch control electrode line and the pixel electrode adjacent to the any one touch control electrode line changes; acquiring touch control information according to the capacitance change of the first touch control capacitor comprises: determining the touch control information according to a position where the any one touch control electrode line is; the OLED display panel comprises an electrode layer on the base substrate, and the method further comprises: detecting whether a capacitance of a second touch control capacitor changes, wherein the second touch control capacitor is a capacitor formed by any one touch control electrode line of the plurality of touch control electrode lines and the electrode layer; acquiring touch control information according to a capacitance change of the second touch control capacitor when the capacitance of the second touch control capacitor changes; detecting whether the capacitance of the second touch control capacitor changes comprises: loading an alternating current of a specified frequency between the any one touch control electrode line and the electrode layer; determining that the capacitance of the second touch control capacitor changes when the frequency of the alternating current between the touch control electrode line and the electrode layer changes; and acquiring touch control information according to the capacitance change of the second touch control capacitor comprises: determining the touch control information according to a position where the any one touch control electrode line is.

According to yet another aspect of the present disclosure, there is provided a storage medium, wherein when instructions in the storage medium are executed by a control component of a touch control display, the control component is capable of performing a method for controlling a touch control display, the touch control display comprises an organic light emitting diode (OLED) display panel and a touch control component; the OLED display panel comprises a base substrate and a plurality of pixel electrodes on the base substrate; and the touch control component comprises a plurality of touch control electrode lines between the plurality of pixel electrodes; and the method comprises: detecting whether a capacitance of a first touch control capacitor changes, wherein the first touch control capacitor is formed by any one touch control electrode line of the plurality of touch control electrode lines and a pixel electrode adjacent to the any one touch control electrode line; and acquiring touch control information according to a capacitance change of the first touch control capacitor when the capacitance of the first touch control capacitor changes.

DETAILED DESCRIPTION

Embodiments of the present disclosure will be described below with reference to the accompanying drawings.

Figure 1:
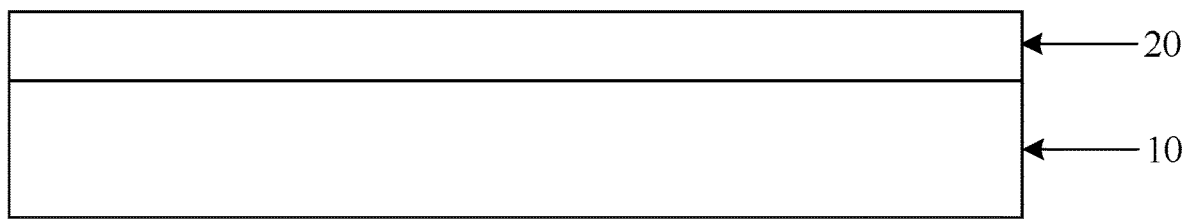
FIG. 1 is a schematic structural diagram of a touch control display in the related art.

At present, a touch control component applied to an OLED display panel is usually disposed at the outside of the OLED display panel. The technology for disposing the touch control component in this way may be referred to as an On-Cell technology, which has low manufacture difficulty. However, as shown in FIG. 1, the overall thickness of the touch control display formed by the touch control component 20 disposed at the outside of the OLED display panel 10 and the OLED display panel is thick.

Figure 2:
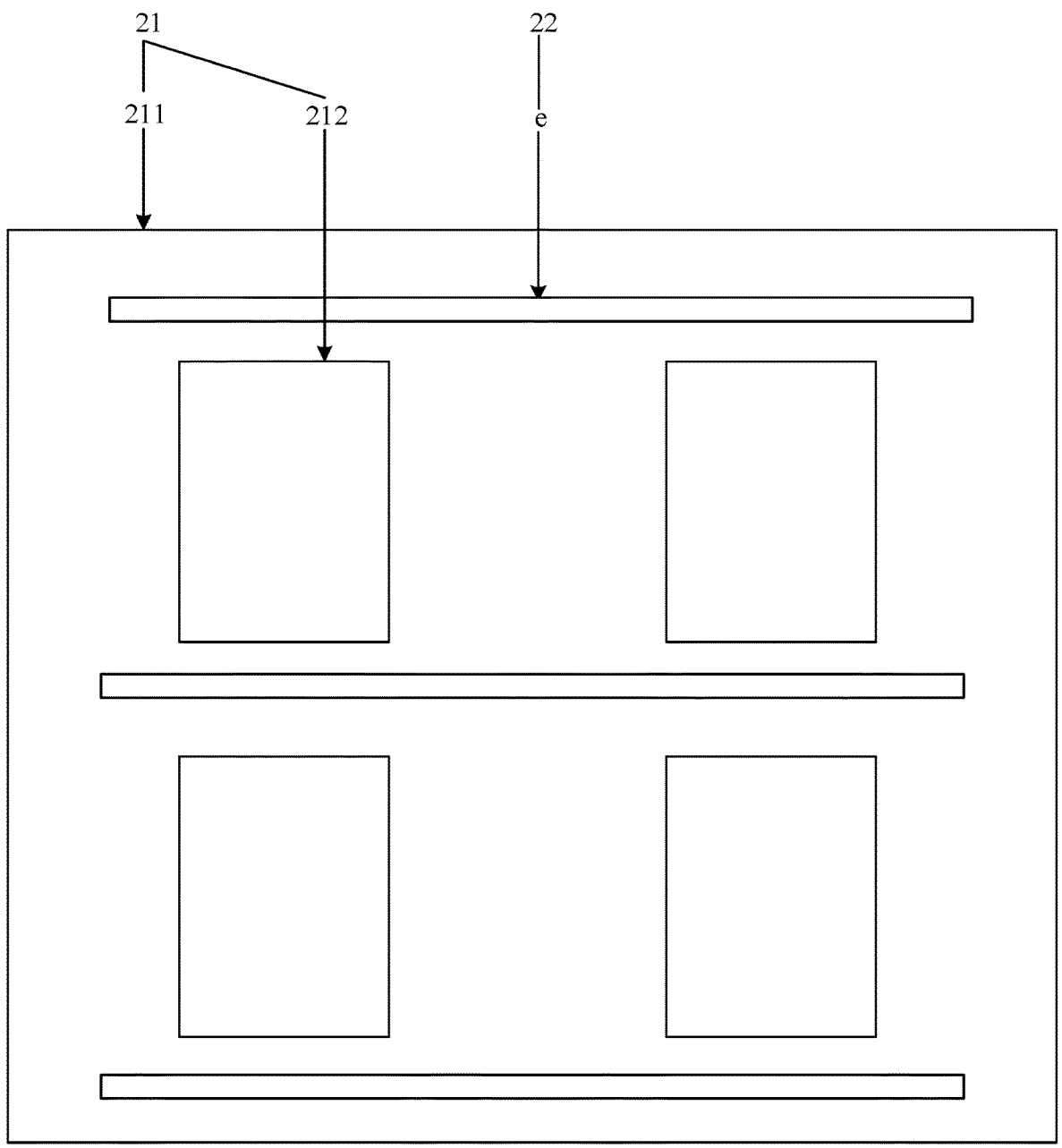
FIG. 2 is a schematic structural diagram of a touch control display according to an embodiment of the present disclosure.

FIG. 2 is a schematic structural diagram of a touch control display according to an embodiment of the present disclosure. The touch control display may include an OLED display panel 21 and a touch control component 22.

The OLED display panel 21 includes a base substrate 211 and a plurality of pixel electrodes 212 on the base substrate 211.

The touch control component 22 includes a plurality of touch control electrode lines e between the plurality of pixel electrodes 212. Any one control electrode line of the plurality of touch control electrode lines e is configured to form a first touch control capacitor (not shown in FIG. 2) along with a pixel electrode 212 adjacent to the any one touch control electrode line. Therefore, touch control information may be acquired according to the capacitance change of the first touch control capacitor.

Here, when a finger (or other objects for touch control, such as a stylus pen) touches the OLED display panel 21, the capacitance of the first touch control capacitor is affected, and the touch control information may be determined according to the change. The touch control information may include information, such as the position, region, and strength of the touch.

The touch control electrode lines in the touch control component are disposed between the pixel electrodes, such that the touch control function may be realized without increasing the thickness of the touch control display.

The embodiments of the present disclosure provide a touch control display using In-Cell technology.

In summary, the embodiments of the present disclosure provide a touch control display. The touch control electrode lines in the touch control component are disposed between the pixel electrodes, and touch control information is acquired according to the change of capacitance between the touch control electrode line and the pixel electrode, so that the touch control component is integrated inside the display panel. The problem of the thick thickness of the touch control display in the related art is solved, and the effect of reducing the thickness of the touch control display is achieved.

Figure 3:
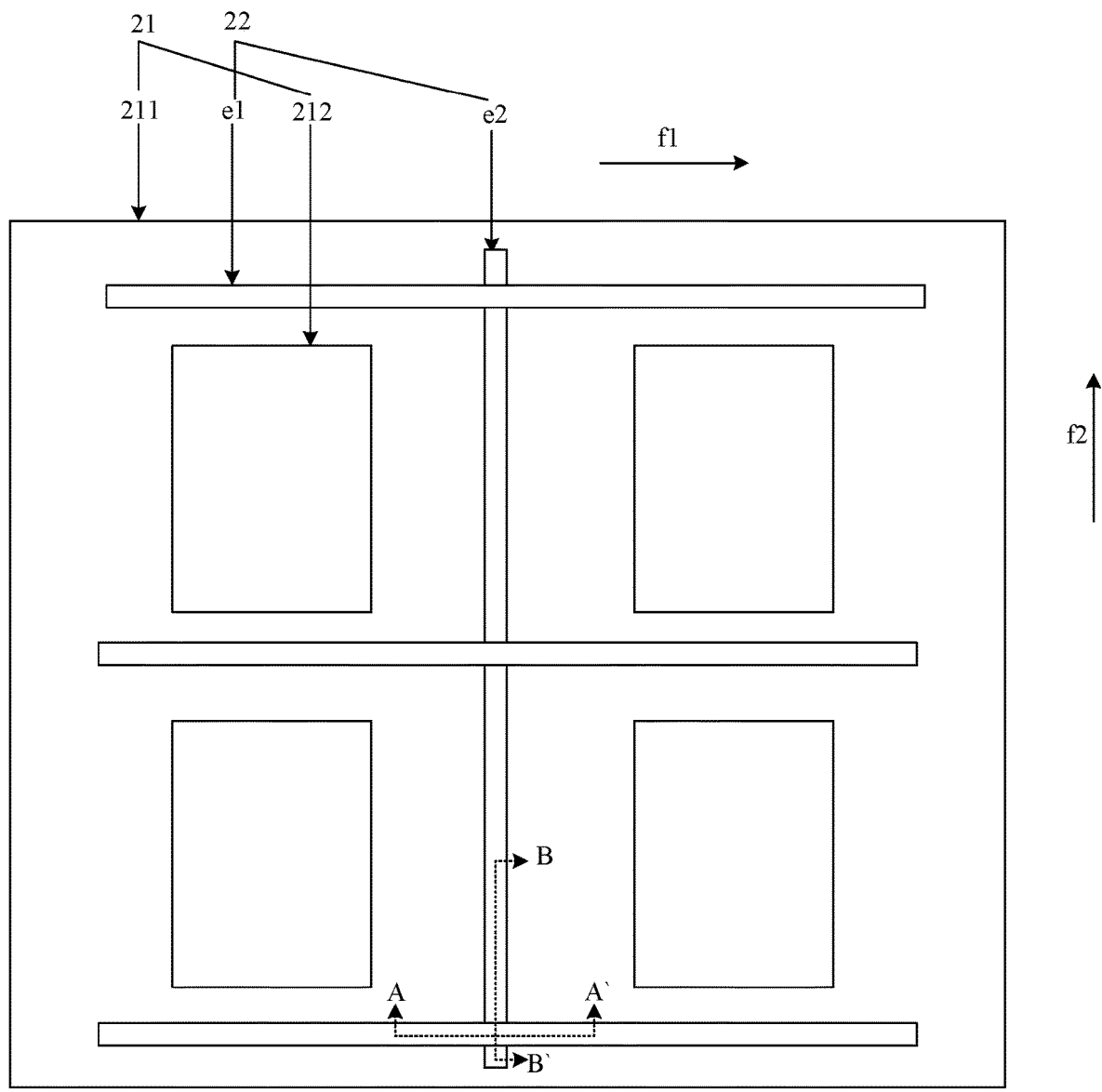
FIG. 3 is a schematic structural diagram of another touch control display according to an embodiment of the present disclosure.

FIG. 3 is a schematic structural diagram of another touch control display according to an embodiment of the present disclosure. The touch control display has been adjusted based on the touch control display shown in FIG. 2.

Optionally, the plurality of touch control electrode lines e includes a plurality of first electrode lines e1 arranged along a first direction f1 and a plurality of second electrode lines e2 arranged along a second direction f2. The first direction f1 is not parallel to the second direction f2. With this structure, the orthographic projections of the first electrode lines e1 on the base substrate 211 and the orthographic projections of the second electrode lines e2 on the base substrate 211 may have a plurality of intersections. The position of the intersection between the orthographic projection of the first electrode line e1, which has detected the capacitance change, on the base substrate 211 and the orthographic projection of the second electrode line e2, which has detected the capacitance change, on the base substrate 211 may be taken as relatively an accurate touch control position, to improve the accuracy of the acquired touch control information.

Optionally, the first direction f1 and the second direction f2 are perpendicular to each other. With this structure, the position of the first electrode lines e1 and the position of the second electrode line e2 may correspond to the x coordinate and the y coordinate in the plane rectangular coordinate system, respectively. The x-coordinate and the y-coordinate of the touch control point may be accurately determined based on the positions of the first electrode line e1 and the second electrode line e2 whose capacitance change has been detected.

Optionally, each of the first electrode lines e1 is a composite structure made from titanium, aluminum, and titanium. The first electrode line e1 may be formed by a composite film layer made from titanium, aluminum, and titanium by a patterning process. In the embodiments of the present disclosure, the patterning process may include steps of photoresist coating, photoresist exposure, developing, etching, and photoresist stripping, etc.

In addition, the material of the first electrode line e1 may also include molybdenum (Mo).

Optionally, each of the second electrode lines e2 is a composite structure made from indium tin oxide, silver, and indium tin oxide. The second electrode line e2 may be formed by a composite film layer made from indium tin oxide, silver, and indium tin oxide by a patterning process.

In order to clearly show the pixel electrode 212, FIG. 3 does not show other structures on the base substrate 211, except the pixel electrode 212 and the touch control component 22, but this is not to limit the structure of the touch control display. The touch control display may also include other structures, which is not limited in the embodiments of the present disclosure.

Figure 4:
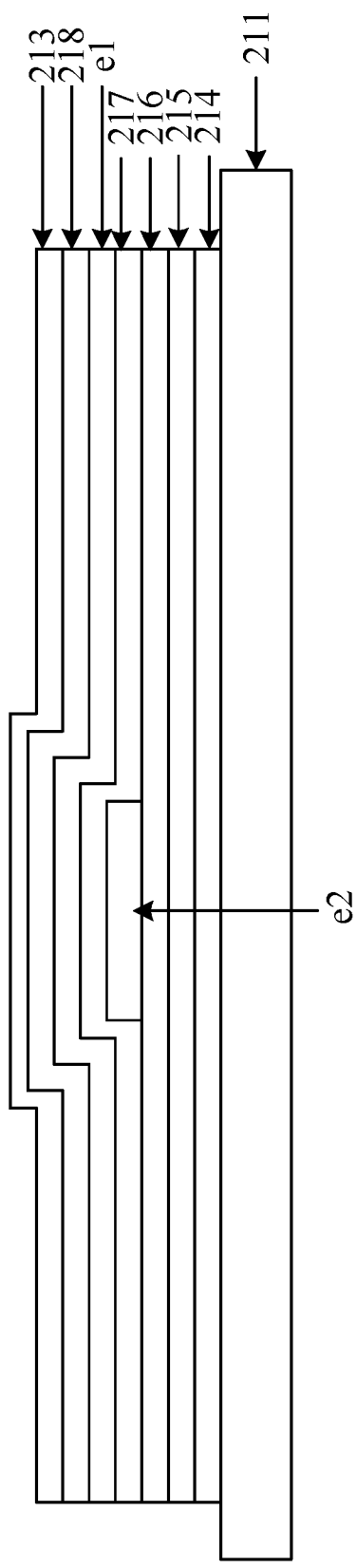
FIG. 4 is a cross-sectional diagram of the touch control display shown in FIG. 3.

As shown in FIG. 4, it is a cross-sectional diagram of the touch control display shown in FIG. 3 at A-A'. The OLED display panel includes an electrode layer 213. Any of the touch control electrode lines (the first electrode line e1, and/or the second electrode line e2) is further configured to form a second touch control capacitor with the electrode layer 213. Therefore, the touch control information may be acquired according to the capacitance change of the second touch control capacitor and the first touch control capacitor. The first touch control capacitor may be formed by any one first electrode line and one or more pixel electrodes adjacent to the any one electrode line (the first electrode line is generally adjacent to a plurality of pixel electrodes).

In the embodiments of the present disclosure, other structures may further be on the base substrate 211. Exemplarily, the second electrode lines e2 may be on the base substrate 211 with a buffer layer 214, a gate insulating layer (GI) 215, and an inter-layer dielectric layer (ILD) 216. A planarization layer 217 may be disposed on the base substrate 211 with the second electrode lines e2. The first electrode lines e1 may be disposed on the base substrate 211 with the planarization layer 217. A pixel definition layer (PDL) 218 is disposed on the base substrate 211 with the second electrode lines e2. The electrode layer 213 is on the base substrate 211 with the pixel definition layer 218. The material of the base substrate 211 may include glass. The material of the buffer layer 214, the gate insulating layer 215, and the inter-layer dielectric layer 216 may include silicon nitride (chemical formula: SiNx) or silicon oxide (chemical formula: SiOx). The material of the planarization layer 217 and the pixel definition layer 218 may include polyimide (PI). The source traces and drain traces may be a composite film layer made from Ti/Al/Ti or a film layer made from Mo. The electrode layer 213 may be a composite film made from magnesium and silver.

Figure 5:
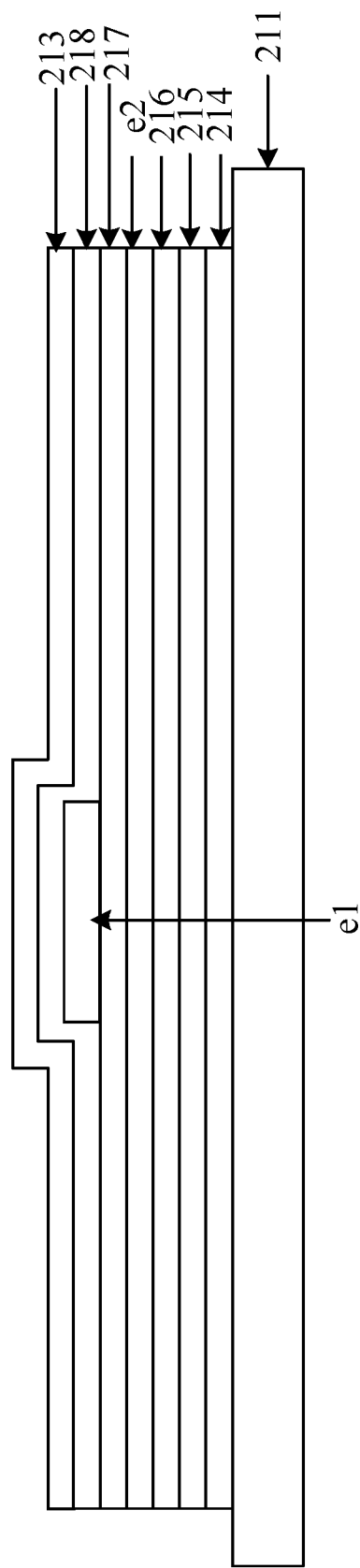
FIG. 5 is another cross-sectional diagram of the touch control display shown in FIG. 3.

As shown in FIG. 5, it is a cross-sectional diagram of the touch control display shown in FIG. 3 at B-B'. The second electrode lines e2 may be on the base substrate 211 with the buffer layer 214, the gate insulating layer 215, and the inter-layer dielectric layer 216. The planarization layer 217 may be disposed on the base substrate 211 with the second electrode lines e2. The first electrode lines e1 may be on the base substrate 211 with the planarization layer 217. The pixel definition layer 218 is disposed on the base substrate 211 with the second electrode lines e2. The electrode layer 213 is on the base substrate 211 with the pixel definition layer 218.

Figure 6:
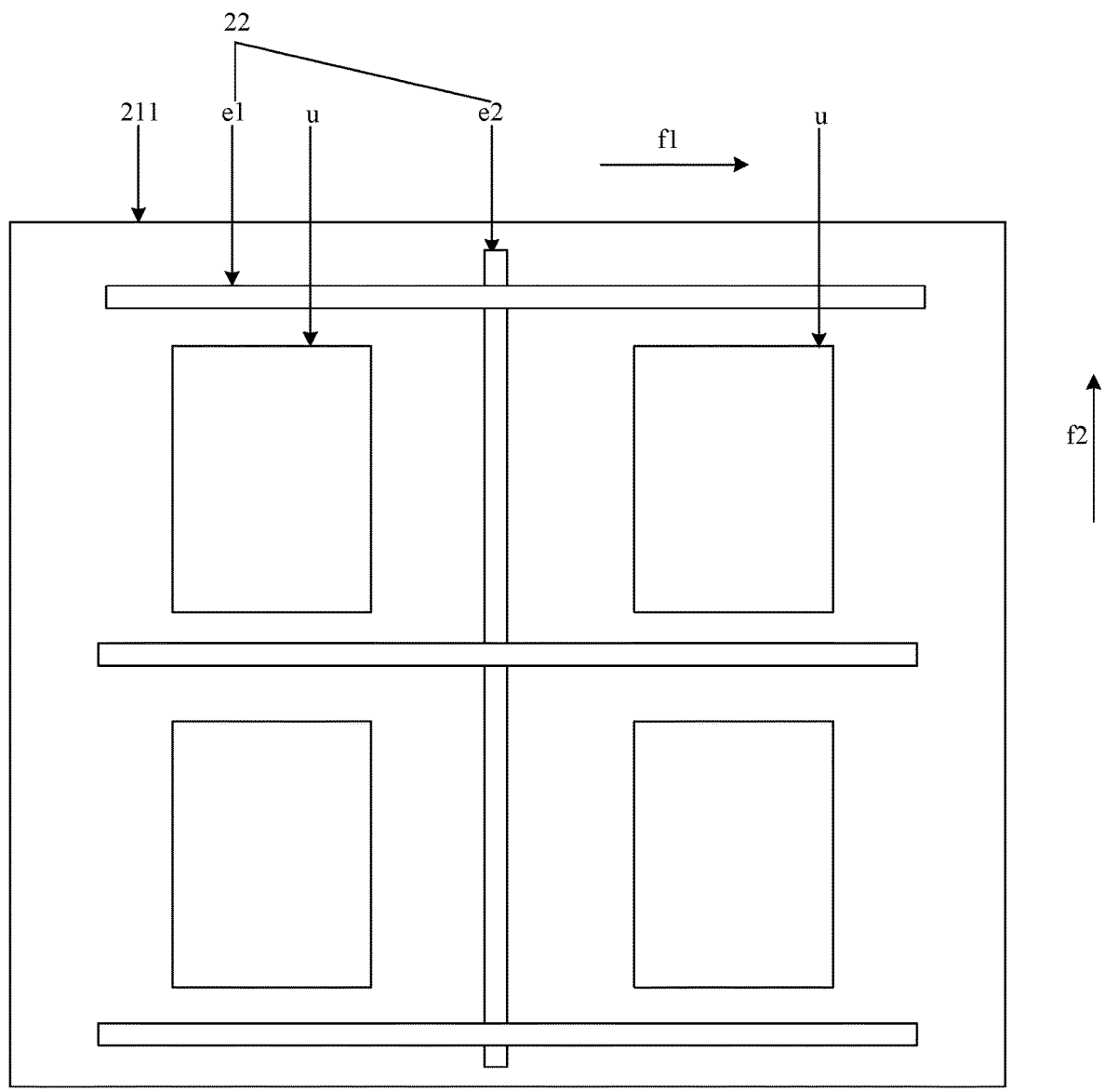
FIG. 6 is a schematic structural diagram of another touch control display according to an embodiment of the present disclosure.

FIG. 6 is a schematic structural diagram of yet another touch control display according to an embodiment of the present disclosure. A plurality of second electrode lines e2 and a plurality of first electrode lines e1 define a plurality of regions on the base substrate, and each region has at least one display unit u.

Figure 7:
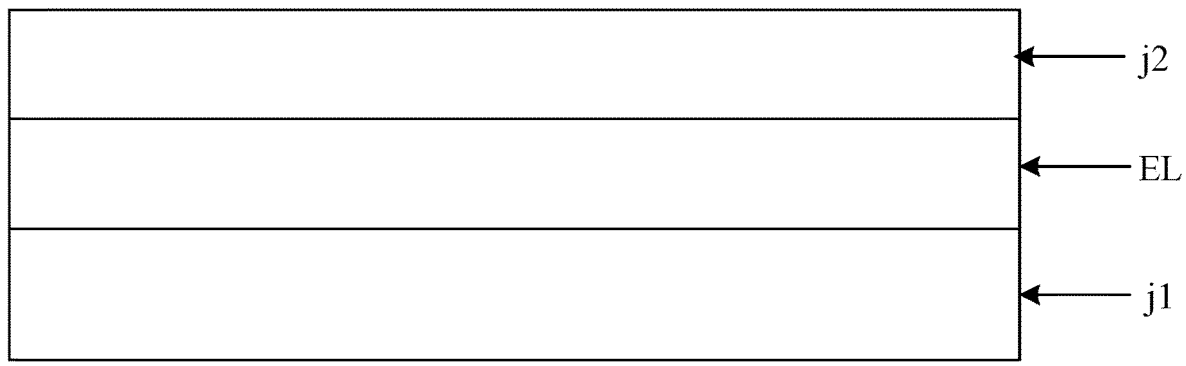
FIG. 7 is a cross-sectional diagram of a display unit in the touch control display of FIG. 6.

As shown in FIG. 7, it is a cross-sectional diagram of the display unit u shown in FIG. 6. Here, each display unit u includes two electrodes (j1 and j2) and an electroluminescent layer EL between the two electrodes. One of the two electrodes (j1 and j2) is a pixel electrode (such as the pixel electrode 212 shown in FIG. 4, which may be an anode), and the other electrode is an electrode layer (such as the electrode layer 213 shown in FIG. 3, which may be a cathode). Each of the plurality of display units u on the base substrate may include one pixel electrode, and the plurality of display units u share one electrode layer. The electrode layer may be one electrode in each display unit.

Figure 8:
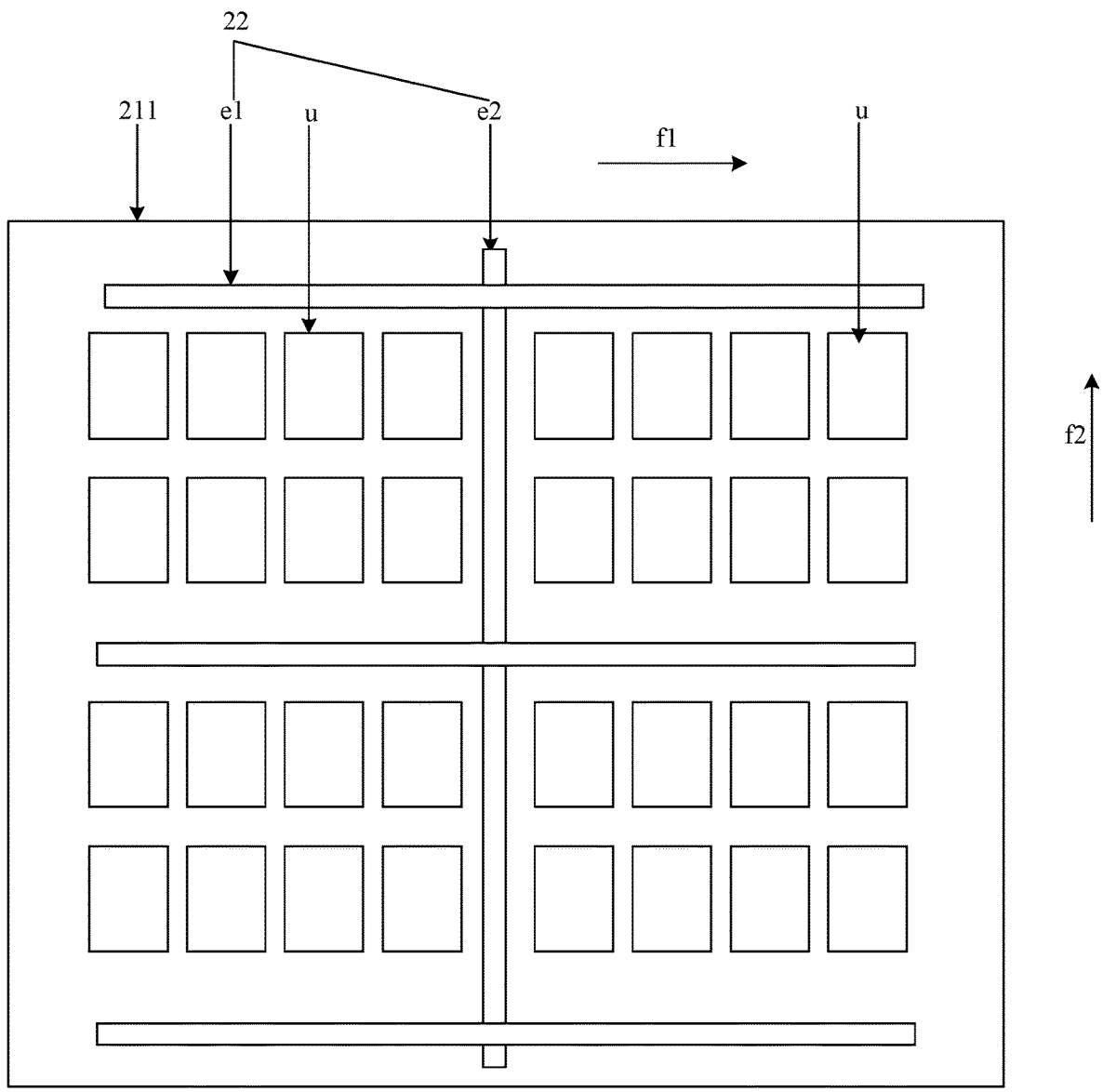
FIG. 8 is a schematic structural diagram of yet another touch control display according to an embodiment of the present disclosure.

In addition, FIG. 6 shows a case where one display unit is disposed in each region. However, more display units may also be in each of the plurality of regions defined by the second electrode lines e2 and the first electrode lines e1 on the base substrate 211. Illustratively, as shown in FIG. 8, it shows a case where each region includes 8 display units u. In addition, each region may have more or less display units u, which is not limited in the embodiments of the present disclosure. The meaning of the numerals in FIG. 8 may be referred to those in FIG. 6, and details are not described here again.

In the touch control display shown in FIG. 6, the base substrate 211 may further have a thin film transistor (TFT) array (not shown in FIG. 6). The TFT array may be configured to drive and control the display unit u. The TFT array may have source-drain (the source-drain includes a source and a drain) traces. The TFT driving each display unit u may be a depletion-mode thin film transistor (DTFT), which may be driven by a plurality of metal oxide semiconductor (MOS) field effect transistors (FET), each of which has an n-type substrate and a p-channel and, carries a current by means of the flow of holes.

Optionally, the plurality of first electrode lines e1 is disposed in the same layer as the source/drain traces. That is, the first electrode lines e1 and the source traces and drain traces in the display unit may be formed by a source-drain metal layer by one patterning process, which saves material and reduces manufacturing processes.

Optionally, the plurality of second electrode lines e2 is disposed in the same layer as the plurality of pixel electrodes (the pixel electrode may be an electrode in the display unit shown in FIG. 7). That is, the second electrode lines e2 and the pixel electrode in the display unit may be formed by a transparent conductive film layer by one patterning process, which saves material and reduces manufacturing processes.

In addition, the first electrode lines e1 and the second electrode lines e2 may also be disposed in the same layer as other structures on the base substrate 211, which is not limited in the embodiments of the present disclosure.

Figure 9:
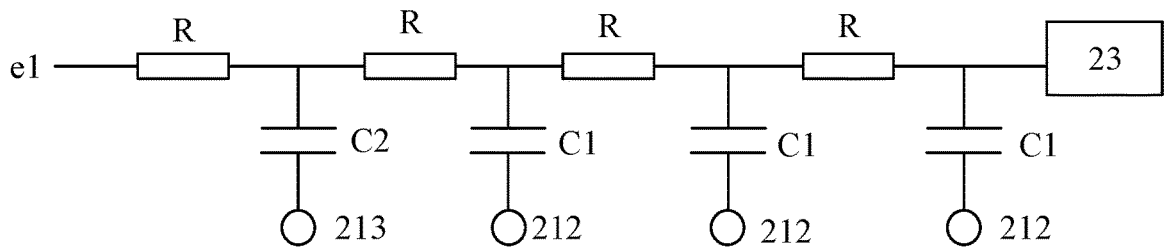
FIG. 9 is a schematic diagram of circuits of a first electrode line, a first touch control capacitor, and a second touch control capacitor according to an embodiment of the present disclosure.

As shown in FIG. 9, it is a structural schematic diagram showing the circuit of a first electrode line e1, a first touch control capacitor C1, and a second touch control capacitor C2 in the touch control display provided in the embodiments of the present disclosure. The first electrode line e1 and the electrode layer 213 form the second touch control capacitor C2. The first electrode line e1 and the pixel electrodes 212 in different sub-pixel regions (the region occupied by one display unit may be one sub-pixel region) form a plurality of first touch control capacitors C1, respectively. R is an equivalent resistance at different sections of the first electrode line e1, and the respective Rs may be equal or unequal.

When a user touches the touch control display, the finger (or other objects for touch control) generates a new capacitor with the first electrode line e1. The new capacitor may be connected to the first touch control capacitor C1, and affect the capacitance of the first touch control capacitor C1. The touch control information may be acquired by monitoring the capacitance change of the first touch control capacitor C1 through the first electrode line e1. The case of monitoring the capacitance of the second touch control capacitor C2 is similar to that of the first touch control capacitor C1, and details are not described here again.

Optionally, the touch control display includes a control component 23, which is connected to the control component. As shown in FIG. 9, the control component 23 may be connected to the first electrode line e1. The control component 23 may be a touch control integrated circuit (IC).

The structure of the second electrode line and the second touch control capacitor may be referred to FIG. 8, and details are not described here again.

In summary, the embodiments of the present disclosure provide a touch control display. The touch control electrode line in the touch control component is disposed between the pixel electrodes and the touch control information is acquired according to the capacitance change between the touch control electrode line and the pixel electrode, so that the touch control component is integrated inside the display panel. The problem that the thickness of the touch control display is thick in the related art is solved, and the effect of reducing the thickness of the touch control display is achieved.

Figure 10:
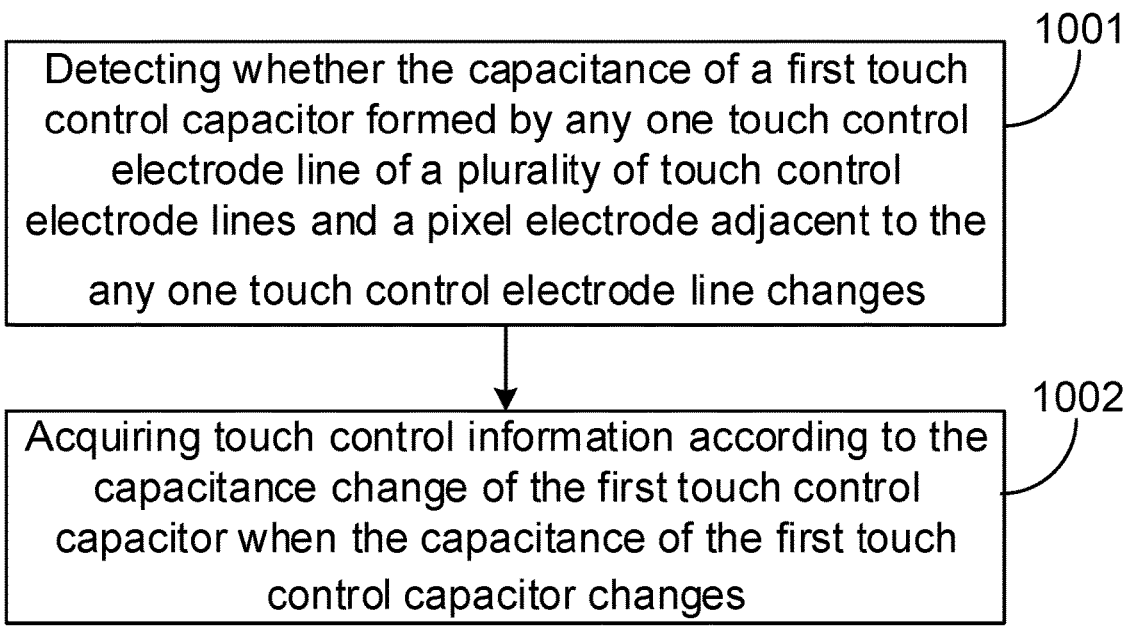
FIG. 10 is a flowchart of a method for controlling a touch control display according to an embodiment of the present disclosure.

FIG. 10 is a flowchart of a method for controlling a touch control display according to an embodiment of the present disclosure. The method may be applied to control the touch control displays provided in the foregoing embodiments. The method may include the following steps.

In step 1001, it is detected whether the capacitance of a first touch control capacitor formed by any one touch control electrode line of a plurality of touch control electrode lines and a pixel electrode adjacent to the any one touch control electrode line changes.

In step 1002, when the capacitance of the first touch control capacitor changes, touch control information is acquired according to the capacitance change of the first touch control capacitor.

In summary, according to the method for controlling a touch control display provided in the embodiments of the present disclosure, the touch control information is acquired according to the capacitance change between the touch control electrode line and the pixel electrode, so that the touch control component may be integrated inside the display panel. The problem that the thickness of the touch control display is thick in the related art is solved, and the effect of reducing the thickness of the touch control display is achieved.

Figure 11:
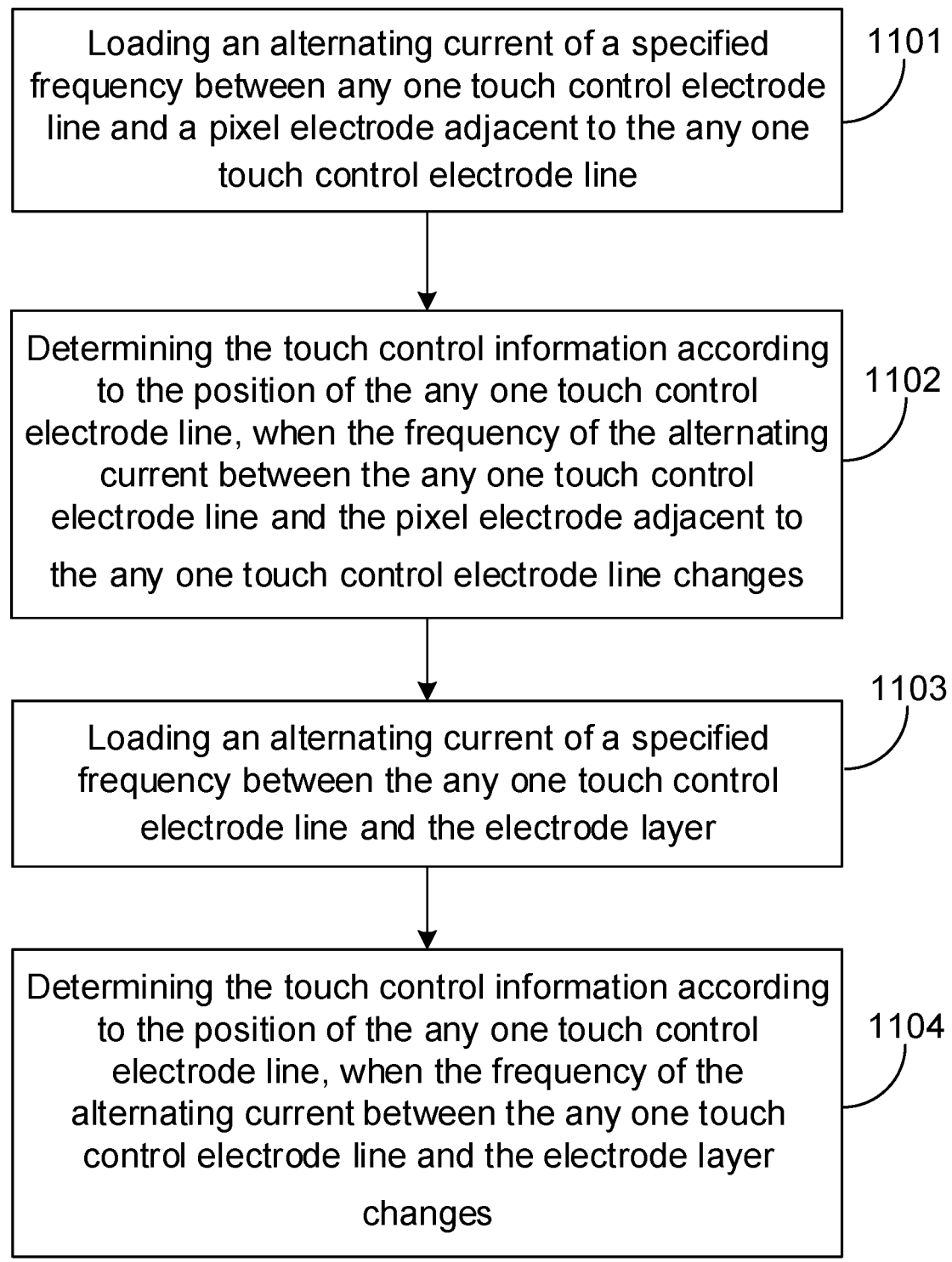
FIG. 11 is a flowchart of another method for controlling a touch control display according to an embodiment of the present disclosure.

FIG. 11 is a flowchart of another method for controlling a touch control display according to an embodiment of the present disclosure. The method may be applied to control the touch control displays provided in the foregoing embodiments. The method may include the following steps.

In step 1101, an alternating current of a specified frequency is loaded between any one touch control electrode line and a pixel electrode adjacent to the any one touch control electrode line.

Figure 12:
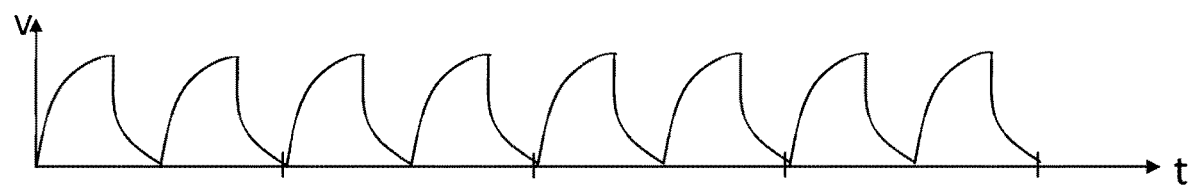
FIG. 12 is a schematic diagram showing a relationship between voltage on a first electrode line and second electrode line in the embodiment shown in FIG. 11 and time.

Taking the circuit diagram shown in FIG. 8 as an example, after an alternating current of a specified frequency (the specified frequency may be predetermined) is loaded between any one touch control electrode line and a pixel electrode adjacent to the any one touch control electrode line, the relationship between voltage on the first electrode line and the second electrode line and time may be as shown in FIG. 12. Here, the abscissa represents time and the ordinate represents voltage (in volts (V)).

In step 1102, when the frequency of the alternating current between the any one touch control electrode line and the pixel electrode adjacent to the any one touch control electrode line changes, the touch control information is determined according to the position of the any one touch control electrode line.

Figure 13:
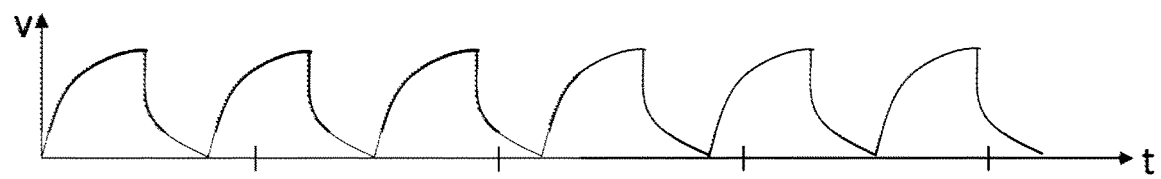
FIG. 13 is a schematic diagram showing a relationship between voltage on another first electrode line and second electrode line in the embodiment shown in FIG. 11 and time.

When a user touches the touch control display, the finger (or other objects for touch control) generates a new capacitor with the first electrode line (or the second electrode line). The new capacitor may be connected to the first touch control capacitor (or the second touch control capacitor) and affects the capacitance of the first touch control capacitor (or the second touch control capacitor), thereby causing the frequency of the voltage on the first electrode line (or the second electrode line) to change. For example, as shown in FIG. 13, it is a schematic diagram showing the relationship between the voltage on the first electrode line and the second electrode line and time after touch by a user. Here, the abscissa represents time (the time represented by the unit length of the horizontal axis in FIG. 13 is equal to the time represented by the unit length of the horizontal axis in FIG. 12), and the ordinate represents voltage (in volts (V)).

It can be seen that the frequency of the voltage is smaller than the frequency before touch by a user in FIG. 12. Thus, the first electrode line and the second electrode line closest to the position of the user's touch control can be determined. The overlapping position between the first electrode line and the second electrode line may be determined as the touch control position.

Steps 1101 to 1102 show a method for monitoring the capacitance change of the first touch control capacitor. However, the capacitance change of the first touch control capacitor may also be monitored by other methods, which is not limited in the embodiments of the present disclosure.

In step 1103, an alternating current of a specified frequency is loaded between the any one touch control electrode line and the electrode layer.

In addition, the touch control operation of the user may be also sensed by a second touch control capacitor formed by the touch control electrode line and the electrode layer.

In step 1104, when the frequency of the alternating current between the any one touch control electrode line and the electrode layer changes, the touch control information is determined according to the position of the any one touch control electrode line.

The way of determining the touch control information is the same as the way in step 1001 and step 1002.

In the embodiments of the present disclosure, the way of determining the touch control information in steps 1103 to 1104 and the way of determining the touch control information in steps 1001 to 1002 may be used alternatively, or may be used at together, which is not limited in the embodiments of the present disclosure.

The method for controlling the touch control display provided in the embodiments of the present disclosure may be performed by a control component. The control component may scan all the first electrode lines and the second electrode lines in the touch control display sequentially, to obtain the positions of all the touch control points and analyze the positions of these touch control points. Exemplarily, if a region formed by a plurality of close touch control points is similar to a finger in size, the touch control points may be determined as one touch control point. If the touch control points are at a plurality of different positions and the region formed by the touch control points exceeds a finger in size, it may be determined that the touch control is a multi-point touch control. If the position of the touch control point changes regularly with time, it is determined that the touch control is a finger-sliding touch control.

In summary, according to the method for controlling the touch control display provided in the embodiments of the present disclosure, the touch control information is acquired according to the capacitance change between the touch control electrode line and the pixel electrode, so that the touch control component can be integrated inside the display panel. The problem that the thickness of the touch control display is thick in the related art is solved, and the effect of reducing the thickness of the touch control display is achieved.

The embodiments of the present disclosure further provide a storage medium, such as a memory including instructions. The instructions may be executed by a control component in a touch control display to complete the methods for controlling the touch control display in the above embodiments. For example, the storage medium may be a read-only memory (ROM), a random-access memory (RAM), a compact disc read-on memory (CD-ROM), a tape, a floppy disk, and an optical data storage device, etc.

The term "and/or" in the present disclosure describes the correspondence of the corresponding objects, indicating three kinds of relationship. For example, A and/or B, may be expressed as: A exists alone, A and B exist concurrently, B exists alone. The character "/" generally indicates that the context object is an "OR" relationship.

It should be noted that in the accompanying drawings, for clarity of illustration, the dimension of the layers and regions may be scaled up. It can be understood that when an element or layer is described as being "on" another element or layer, the described element or layer may be directly on the other element or layer, or there may be an intermediate layer. In addition, It can be understood that when an element or layer is described as being "below" another element or layer, the described element or layer may be directly below the other element or layer, or there may be more than one intermediate layers. In addition, it can further be understood that when a layer or element is described as being "between" two layers or elements, the described layer or element may be the only layer or element between the two layers or elements, or there may be more than one intermediate layers or elements. In the whole text, similar reference numerals denote similar elements.

In the present disclosure, the terms "first" and "second" are used for description only and are not to be construed as indicating or implying relative importance. The term "plurality" refers to two or more, unless specifically defined otherwise.

Those skilled in the art can understand that all or part of the steps of implementing the above embodiments may be completed by hardware, or may be completed by relevant hardware instructed by programs, and the programs may be stored in a computer readable storage medium. The storage medium may be a read only memory, a magnetic disk or an optical disk or the like.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A touch control display, comprising an organic light emitting diode (OLED) display panel and a touch control component, wherein
the OLED display panel comprises a base substrate and a plurality of pixel electrodes on the base substrate; and
the touch control component comprises a plurality of touch control electrode lines between the plurality of pixel electrodes, and any one touch control electrode line of the plurality of touch control electrode lines is configured to form a first touch control capacitor with a pixel electrode adjacent to the any one touch control electrode line,
wherein the OLED display panel comprises an electrode layer on the base substrate; and
the any one touch control electrode line is configured to form a second touch control capacitor with the electrode layer.

2. The touch control display of claim 1, wherein the plurality of touch control electrode lines comprises a plurality of first electrode lines arranged along a first direction and a plurality of second electrode lines arranged along a second direction, and the first direction is not parallel to the second direction.

3. The touch control display of claim 2, wherein the first direction is perpendicular to the second direction.

4. The touch control display of claim 2, wherein the plurality of first electrode lines and the plurality of second electrode lines define a plurality of regions on the base substrate, each of the regions has at least one display unit, each of the at least one display unit comprises two electrodes and an electroluminescent layer between the two electrodes, and one of the two electrodes is the pixel electrode and the other electrode is the electrode layer.

5. The touch control display of claim 4, wherein the pixel electrode is an anode and the electrode layer is a cathode.

6. The touch control display of claim 2, wherein source traces and drain traces are on the base substrate, and the plurality of first electrode lines is disposed in the same layer as the source/drain traces.

7. The touch control display of claim 6, wherein each of the first electrode lines is a composite structure of titanium, aluminum and titanium.

8. The touch control display of claim 2, wherein each of the second electrode lines is a composite structure of indium tin oxide, silver, and indium tin oxide.

9. The touch control display of claim 2, wherein the plurality of second electrode lines is disposed in the same layer as the plurality of pixel electrodes.

10. The touch control display of claim 1, further comprising: a control component connected to the touch control component.

11. The touch control display of claim 1, wherein the OLED display panel comprises an electrode layer on the base substrate;
the any one touch control electrode line is configured to form a second touch control capacitor with the electrode layer, and acquire touch control information according to capacitance changes of the second touch control capacitor and the first touch control capacitor;
the plurality of touch control electrode lines comprises a plurality of first electrode lines arranged along a first direction and a plurality of second electrode lines arranged along a second direction;
the plurality of first electrode lines and the plurality of second electrode lines define a plurality of regions on the base substrate, each of the regions has at least one display unit, each of the at least one display unit comprises two electrodes and an electroluminescent layer between the two electrodes, and one of the two electrodes is the pixel electrode and the other electrode is the electrode layer;
source traces and drain traces are on the base substrate, and the plurality of first electrode lines is disposed in the same layer as the source/drain traces; and
the plurality of second electrode lines is disposed in the same layer as the plurality of pixel electrodes.

12. A method for controlling a touch control display, applied to a touch control display, wherein the touch control display comprises an organic light emitting diode (OLED) display panel and a touch control component; the OLED display panel comprises a base substrate and a plurality of pixel electrodes on the base substrate; and the touch control component comprises a plurality of touch control electrode lines between the plurality of pixel electrodes;
the method comprising:
detecting whether a capacitance of a first touch control capacitor changes, wherein the first touch control capacitor is a capacitor formed by any one touch control electrode line of the plurality of touch control electrode lines and a pixel electrode adjacent to the any one touch control electrode line; and
acquiring touch control information according to a capacitance change of the first touch control capacitor when the capacitance of the first touch control capacitor changes,
wherein detecting whether a capacitance of a first touch control capacitor changes comprises:
loading an alternating current of a specified frequency between the any one touch control electrode line and the pixel electrode adjacent to the any one touch control electrode line; and
determining that the capacitance of the first touch control capacitor changes when the frequency of the alternating current between the touch control electrode line and the pixel electrode adjacent to the touch control electrode line changes; and
acquiring touch control information according to a capacitance change of the first touch control capacitor comprises:
determining the touch control information according to a position where the any one touch control electrode line is.

13. The method of claim 12, wherein the OLED display panel comprises an electrode layer on the base substrate, the method further comprising:
detecting whether a capacitance of a second touch control capacitor changes, wherein the second touch control capacitor is a capacitor formed by any one touch control electrode line of the plurality of touch control electrode lines and the electrode layer; and acquiring the touch control information according to a capacitance change of the second touch control capacitor when the capacitance of the second touch control capacitor changes.

14. The method of claim 13, wherein detecting whether a capacitance of a second touch control capacitor changes comprises:
loading an alternating current of a specified frequency between the any one touch control electrode line and the electrode layer; and
determining that the capacitance of the second touch control capacitor changes when the frequency of the alternating current between the any one touch control electrode line and the electrode layer changes; and
acquiring touch control information according to a capacitance change of the second touch control capacitor comprises:
determining the touch control information according to a position where the any one touch control electrode line is.

15. The method of claim 12, wherein detecting whether a capacitance of a first touch control capacitor changes comprises:
loading an alternating current of a specified frequency between the any one touch control electrode line and the pixel electrode adjacent to the any one touch control electrode line; and
determining that the capacitance of the first touch control capacitor changes when the frequency of the alternating current between the any one touch control electrode line and the pixel electrode adjacent to the any one touch control electrode line changes;
acquiring touch control information according to the capacitance change of the first touch control capacitor comprises:
determining the touch control information according to a position where the any one touch control electrode line is;
the OLED display panel comprises an electrode layer on the base substrate, and the method further comprises:
detecting whether a capacitance of a second touch control capacitor changes, wherein the second touch control capacitor is a capacitor formed by any one touch control electrode line of the plurality of touch control electrode lines and the electrode layer;
acquiring touch control information according to a capacitance change of the second touch control capacitor when the capacitance of the second touch control capacitor changes;
detecting whether the capacitance of the second touch control capacitor changes comprises:
loading an alternating current of a specified frequency between the any one touch control electrode line and the electrode layer;
determining that the capacitance of the second touch control capacitor changes when the frequency of the alternating current between the touch control electrode line and the electrode layer changes; and
acquiring touch control information according to the capacitance change of the second touch control capacitor comprises:
determining the touch control information according to a position where the any one touch control electrode line is.

16. A non-transitory storage medium, wherein when instructions in the storage medium are executed by a control component of a touch control display, the control component is capable of performing a method for controlling a touch control display, the touch control display comprises an organic light emitting diode (OLED) display panel and a touch control component; the OLED display panel comprises a base substrate and a plurality of pixel electrodes on the base substrate; and the touch control component comprises a plurality of touch control electrode lines between the plurality of pixel electrodes; and
the method comprises:
detecting whether a capacitance of a first touch control capacitor changes, wherein the first touch control capacitor is formed by any one touch control electrode line of the plurality of touch control electrode lines and a pixel electrode adjacent to the any one touch control electrode line; and
acquiring touch control information according to a capacitance change of the first touch control capacitor when the capacitance of the first touch control capacitor changes,
wherein detecting whether a capacitance of a first touch control capacitor changes comprises:
loading an alternating current of a specified frequency between the any one touch control electrode line and the pixel electrode adjacent to the any one touch control electrode line; and
determining that the capacitance of the first touch control capacitor changes when the frequency of the alternating current between the touch control electrode line and the pixel electrode adjacent to the touch control electrode line changes; and
acquiring touch control information according to a capacitance change of the first touch control capacitor comprises:
determining the touch control information according to a position where the any one touch control electrode line is.

* * * * *